United States Patent
Suzuki

[19]

[11] Patent Number: 6,078,737
[45] Date of Patent: *Jun. 20, 2000

[54] DESIGN RULE CHECK METHOD

[75] Inventor: Kyou Suzuki, Tokyo, Japan

[73] Assignee: NEC Corporation, Tokyo, Japan

[ * ] Notice: This patent is subject to a terminal disclaimer.

[21] Appl. No.: 08/932,960

[22] Filed: Sep. 18, 1997

[30] Foreign Application Priority Data

Sep. 24, 1996 [JP] Japan .................................. 8-251152

[51] Int. Cl.[7] .................................................. G06F 17/50
[52] U.S. Cl. .................................. 395/500.2; 395/500.06
[58] Field of Search ................................... 364/480–491,
364/578, 468.15–468.17; 395/500.02–500.22;
382/144, 145, 149

[56] References Cited

U.S. PATENT DOCUMENTS

| | | | |
|---|---|---|---|
| 5,225,993 | 7/1993 | Iwatsuki et al. | 395/500.06 |
| 5,620,916 | 4/1997 | Eden et al. | 395/500.11 |
| 5,706,295 | 1/1998 | Suzuki | 714/724 |

OTHER PUBLICATIONS

Bhat et al., "Special Purpose Architecture for Accelerating Bitmap DRC" 26th *ACM/EEE Design Automation Conference* pp. 674–677 (Jan. 1989).

Crawford et al., "Computer verification fo Large Scale Integrated Circuit Masks" *IEEE* pp. 132–135 (1978).

Modarres et al., "A Formal Approach to Desing–Rule Checking" *IEEE Transactions on Computer–Aided Design* pp. 561–573 (1987), vol. CAD–6, No. 4, Jul. 1987.

Hedenstierna et al. ("The halo algorithm—an algorithm for hierarchical design of rule checking of VLSI circuits", IEEE Transactions on Computer–Aided Design of Integrated Circuits and Systems, vol. 12, No. 2, Feb. 1993, pp. 265–272.

*Primary Examiner*—Kevin J. Teska
*Assistant Examiner*—Phallaka Kik
*Attorney, Agent, or Firm*—Foley & Lardner

[57] ABSTRACT

A design rule check is to inspect whether mask pattern data of a semiconductor integrated circuit is correctly designed in accordance with a design standard or not. A design rule check method of the present invention is characterized in that design rule check errors occurring in the design rule check between a first error and a second error output in accordance with whether the design rule check errors overlap or not.

5 Claims, 10 Drawing Sheets

DESIGN RULE CHECK METHOD

BACKGROUND OF THE INVENTION

1. Field of the Invention

The present invention relates to a design rule check with which whether mask pattern data is correctly designed in accordance with a pertinent design standard is inspected in the manufacture of a semiconductor integrated circuit and the like and, more particularly, to a design rule check method of determining and outputting a design rule check error and using it in correction of mask pattern data and the like.

2. Description of the Prior Art

Figure 1A:
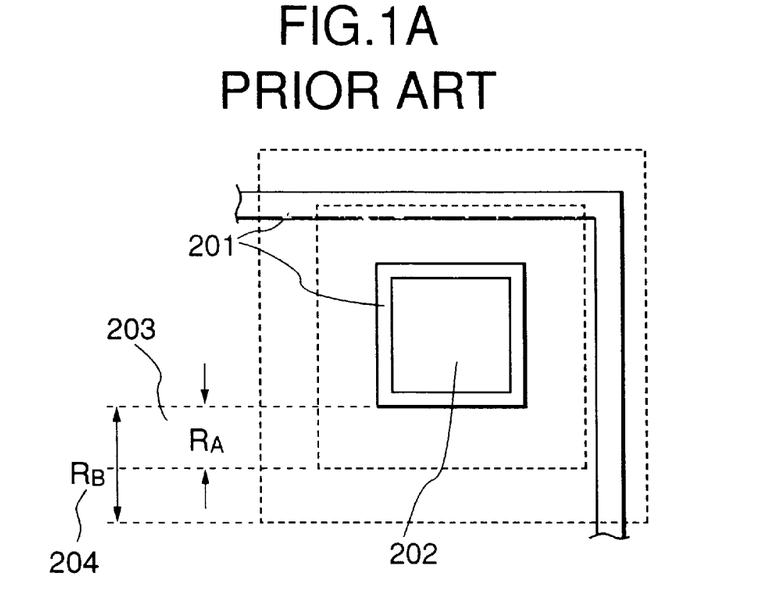
FIG. 1A shows regulation values of the spacing between wiring data around a bonding pad as a design standard example in the conventional technique.
Figure 1B:
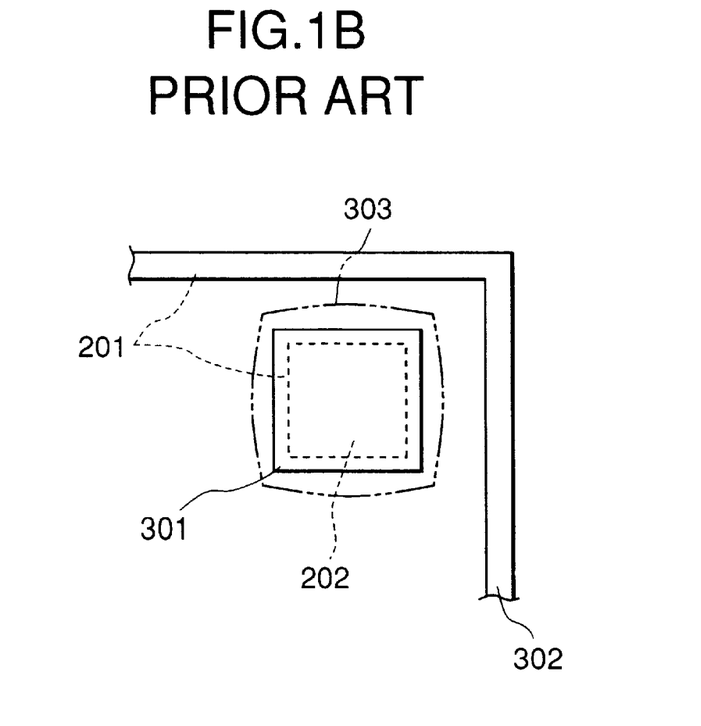
FIG. 1B shows that the wiring data are classified into a wiring line of the pad portion and a wiring line outside the pad portion.

In the manufacture of the semiconductor integrated circuit, whether or not the fabricated mask pattern complies with a predetermined design rule must be inspected prior to the actual manufacture of the semiconductor integrated circuit. In this case, when one design standard is present at one portion of mask pattern data, an error that does not satisfy this design standard is output directly. When a plurality of design standards are present at one portion of mask pattern data, a plurality of errors not satisfying these design standards are output in contention, and it is difficult to obtain a correct inspection result. FIG. 1A shows such an example wherein a plurality of design standards are present at one portion of the mask pattern data. This example will be described by means of the regulation value of the spacing of wiring data 201 around the bonding pad. FIG. 1B shows that wiring data 201 are classified by a bonding pad portion 303 into a wiring line 301 of the pad portion and a wiring line 302 outside the pad portion.

Referring to FIGS. 1A and 1B, pad opening data 202 is part of mask pattern data that constitutes the bonding pad. The bonding pad portion 303 is constituted by forming the pad opening data 202 on the wiring data 201. The wiring data 201 inside the bonding pad portion 303 is classified into the wiring line 301 of the pad portion, and the wiring data 201 outside the bonding pad portion 303 is classified into the wiring line 302 outside the pad portion, respectively. In the design standard on the wiring data 201 around the bonding pad, the spacing between the wiring line 301 of the pad portion and the wiring line 302 outside the pad portion usually has a regulation value $R_B$ 204. When mask pattern data including a wiring line 302 outside the pad portion around the bonding pad is arranged at a high density, the spacing has a regulation value $R_A$ 203. The regulation value $R_A$ 203 is smaller than the regulation value $R_B$ 204. In other words, regulation value $R_A$ 203<regulation value $R_B$ 204.

Based on this design standard example, conventional design rule check methods employed when a plurality of design standards are present at one portion and a plurality of errors contend will be described. Conventionally, three methods are proposed.

Figure 2:
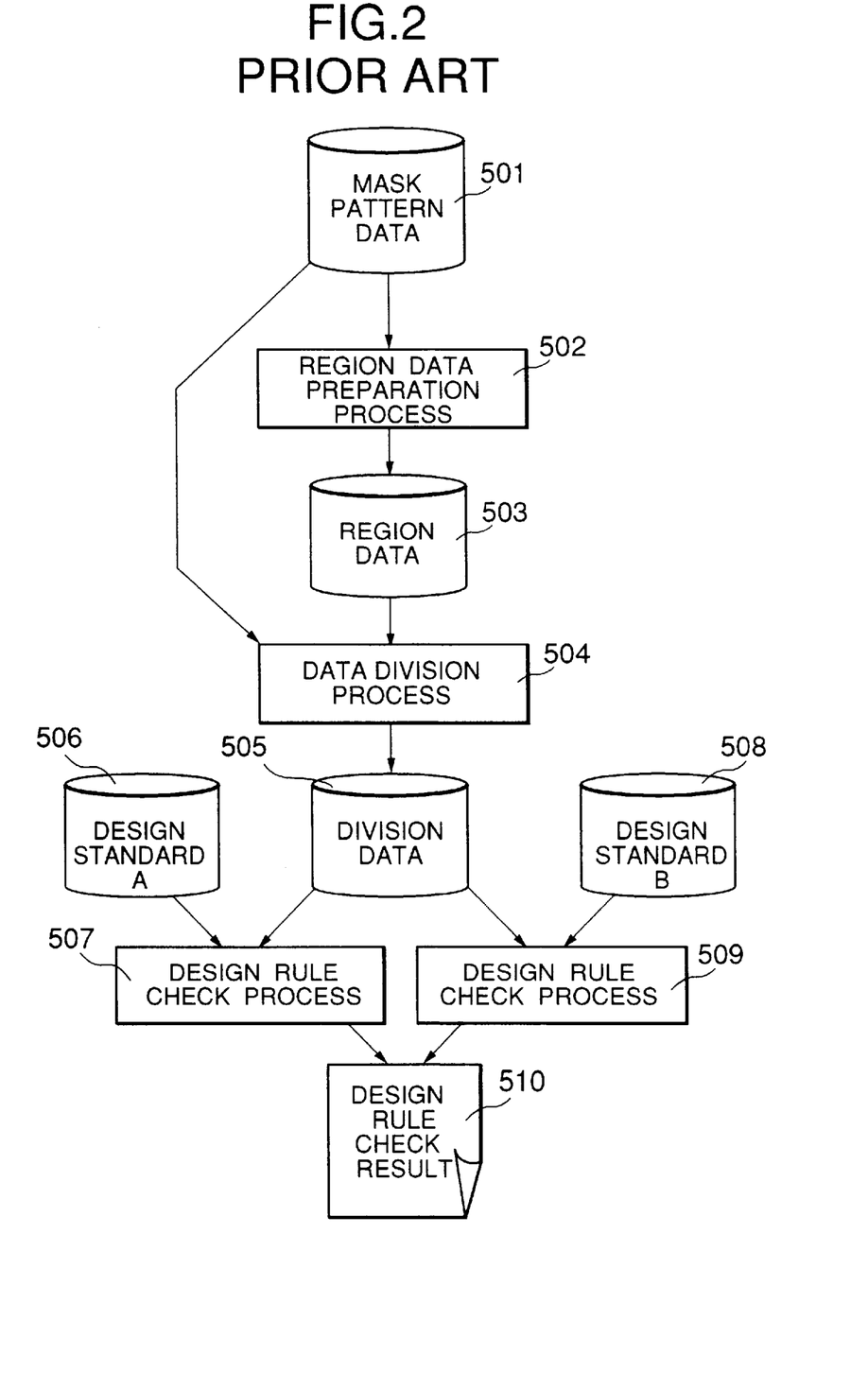
FIG. 2 is a block diagram for explaining the first conventional method.

The first conventional method has a region data preparation process 502, a data division process 504, a design rule check process 507, and a design rule check process 509, as shown in FIG. 2. The region data preparation process 502 inputs mask pattern data 501 and outputs region data 503. The data division process 504 inputs the mask pattern data 501 and the region data 503 and outputs division data 505. The design rule check process 507 inputs and checks a design standard A 506 storing a design rule consisting of a regulation value $R_A$ 203 as the regulation value of the spacing between the wiring line 301 of the pad portion and the wiring line 302 outside the pad portion, and the division data 505. The design rule check process 507 outputs the check result to a design rule check result 510. The design rule check process 509 inputs and checks a design standard B 508 storing a design rule consisting of a regulation value $R_B$ 204 as another regulation value of the spacing between the wiring line 301 of the pad portion and the wiring line 302 outside the pad portion, and the division data 505. The design rule check process 509 outputs the check result to the design rule check result 510.

Figure 3:
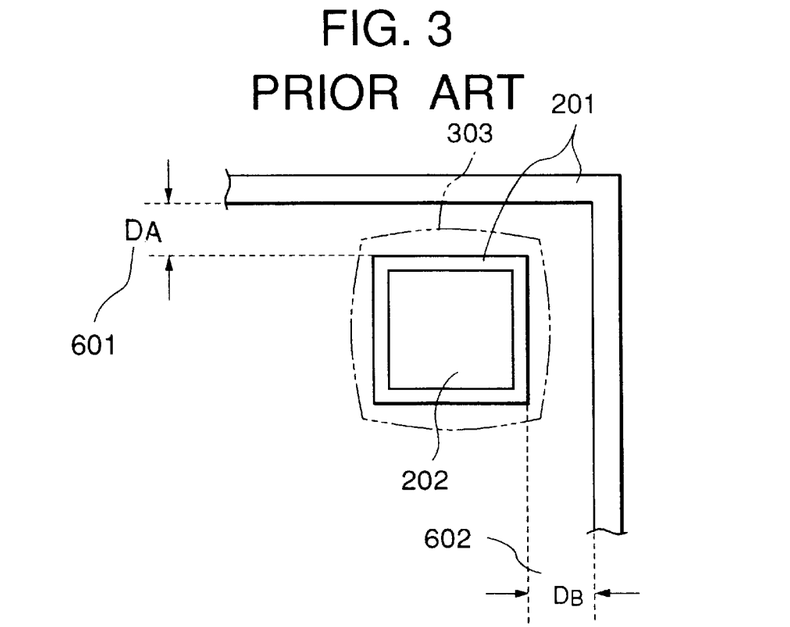
FIG. 3 is a view showing an example of mask pattern data to be examined in a design rule check.

FIG. 3 shows an example of the mask pattern data stored in the mask pattern data 501. The spacing between the wiring data 201 inside the bonding pad portion 303 and the wiring data 201 outside the bonding pad portion 303 includes a design value $D_A$ 601 and a design value $D_B$ 602. The design value $D_A$ 601 is smaller than the regulation value $R_A$ 203 mentioned in the design standard example (design value $D_A$ 601<regulation value $R_A$ 203). The design value $D_B$ 602 is larger than the regulation value $R_A$ 203 and smaller than the regulation value $R_B$ 204 (regulation value $R_A$ 203<design value $D_B$ 602<regulation value $R_B$ 204).

Figure 4:
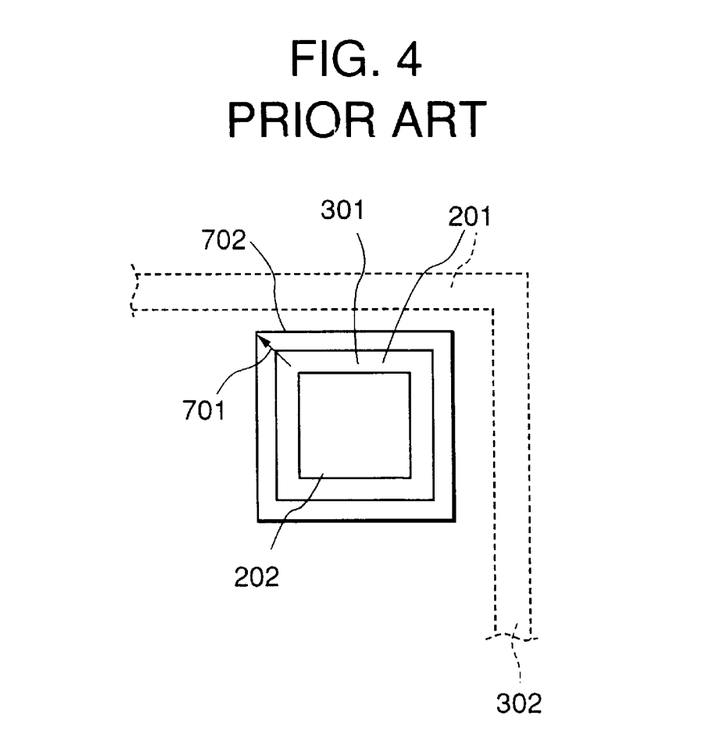
FIG. 4 is a view for explaining a region data preparation process.

According to the first conventional method, first, the pad opening data 202 used for constituting the bonding pad is input from the mask pattern data 501 to the region data preparation process 502. As shown in FIG. 4, a thickening process 701 for the pad opening data 202 is performed by using a graphic operation process to prepare a pad region 702, and the pad region 702 is output to the region data 503. Subsequently, the wiring line 301 and wiring line 302 are output to the division data 505. The wiring line 301 of the pad portion is prepared by obtaining, by using a graphic operation process, the OR of the region data 503 and wiring data 201. The wiring line 302 outside the pad portion is prepared by obtaining, by using a graphic operation process, the exclusive OR of the wiring data 201 and region data 503. The wiring data 201 has been input to the data division process 504 from the mask pattern data 501. The pad region 702 has been input to the data division process 504 from the region data 503.

Figure 5:
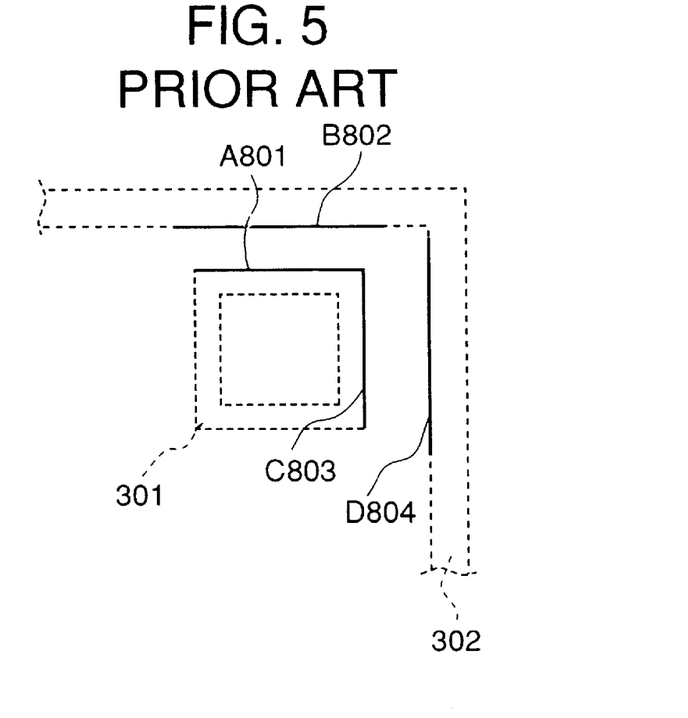
FIG. 5 is a view for explaining a design rule check process.

The design rule check process 507 will be described by means of the case of a design rule consisting of the regulation value $R_A$ 203 stored in the design standard A 506 as the regulation value of the spacing between the wiring line 301 of the pad portion and the wiring line 302 outside the pad portion, the wiring line 301 of the pad portion and the wiring line 302 outside the pad portion which are stored in the division data 505. As shown in FIG. 5, side data (a side A 801 and a side B 802) of a portion where the spacing between the wiring line 301 of the pad portion and the wiring line 302 outside the pad portion becomes smaller than the regulation value $R_A$ 203 is obtained. Polygon data obtained by connecting the vertices of the pair of side A 801 and side B 802 is output to the design rule check result 510 as a design rule check error (an error A 901).

In the design rule check process 509, a process similar to the design rule check process 507 described above is performed except for the design standard B 508 that stores a design rule consisting of a regulation value $R_B$ 204 as another regulation value of the spacing between the wiring line 301 of the pad portion and the wiring line 302 outside the pad portion. As shown in FIG. 5, side data (the side A 801 and side B 802, a side C 803, and a side D 804) of portions where the spacing between the wiring line 301 of the pad portion and the wiring line 302 outside the pad portion becomes smaller than the regulation value regulation value $R_B$ 204 are obtained. Polygon data obtained by connecting the vertices of the pair of side A 801 and side B 802 and the pair of side C 803 and side D 804 is output to the design rule check result 510 as a design rule check error (an error B 902 and an error B 903).

Figure 6:
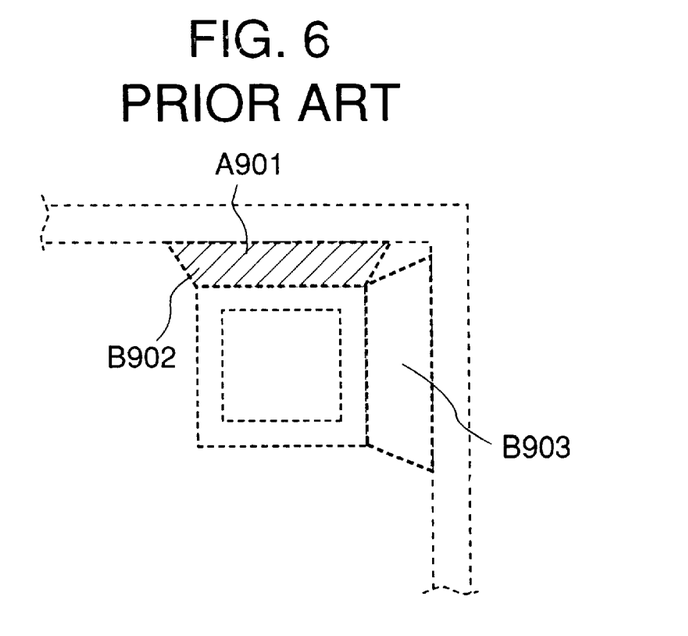
FIG. 6 is a view for explaining a design rule check error.
Figure 7A:
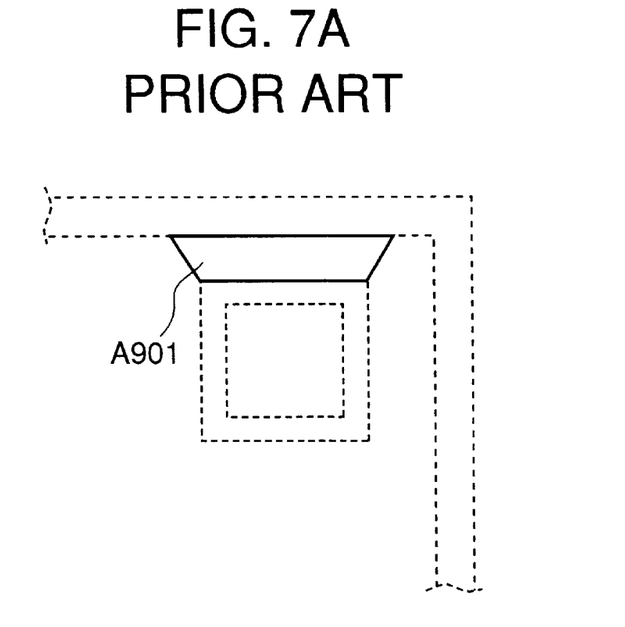
FIGS. 7A and 7B are views for explaining the content of the design rule check error shown in FIG. 6.
Figure 7B:
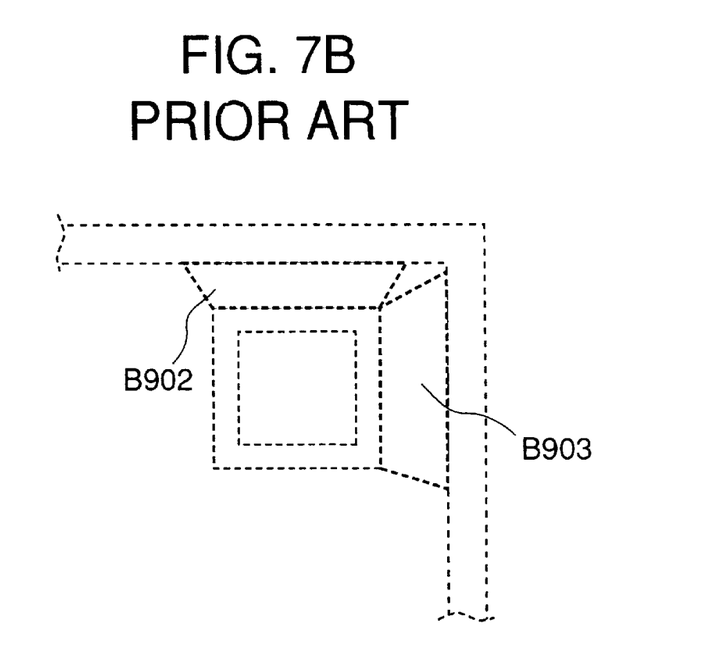

FIG. 6 shows an example of a design rule error which is output to the design rule check result 510, as described above. The error A 901 indicates a design rule error which is output in the design rule check process 507, and the error B 902 and error B 903 indicate design rule errors that are output in the design rule check process 509. FIGS. 7A and 7B describe the content of the design rule errors shown in FIG. 6, in which FIG. 7A shows a design rule error (the error A 901) defined by the regulation value $R_A$ 203 as the regulation value of the spacing between the wiring line 301 of the pad portion and the wiring line 302 outside the pad portion, and FIG. 7B shows design rule errors (the error B 902 and error B 903) defined by the regulation value $R_B$ 204 as another regulation value of the spacing between the wiring line 301 of the pad portion and the wiring line 302 outside the wiring line 302.

Determination as to whether the design rule check error output to the design rule check result 510 is a true error or a pseudo-error is conventionally performed manually through comparison and reference of the design standard example described above, the mask pattern example shown in FIG. 4, and the design rule check result 510 (FIGS. 7A and 7B). From the example of the mask pattern shown in FIG. 3, the error A 901 can be determined as a true error since the spacing between the side A 801 and side B 802 shown in FIG. 5 is the design value $D_A$ 601, which is smaller than the regulation value $R_A$ 203. The error B 903 can be determined as a true error since the spacing between the side C 803 and side D 804 shown in FIG. 7 is the design value $D_B$ 602, which is smaller than the regulation value $R_B$ 204. Regarding the error B 902, it should be dealt with as a true error since the spacing between the side A 801 and side B 802 shown in FIG. 7 is the design value $D_A$ 601, which is smaller than the regulation value $R_B$ 204. However, since the error B 902 recurs at the same portion (the side A 801 and side B 802) where the error A 901 which is determined as a true error occurred. Also, the error portion on the mask pattern can be specified by the error A 901 described above. Thus, the error B 902 need not be handled as a true error and is determined as a kind of pseudo-error.

Figure 8:
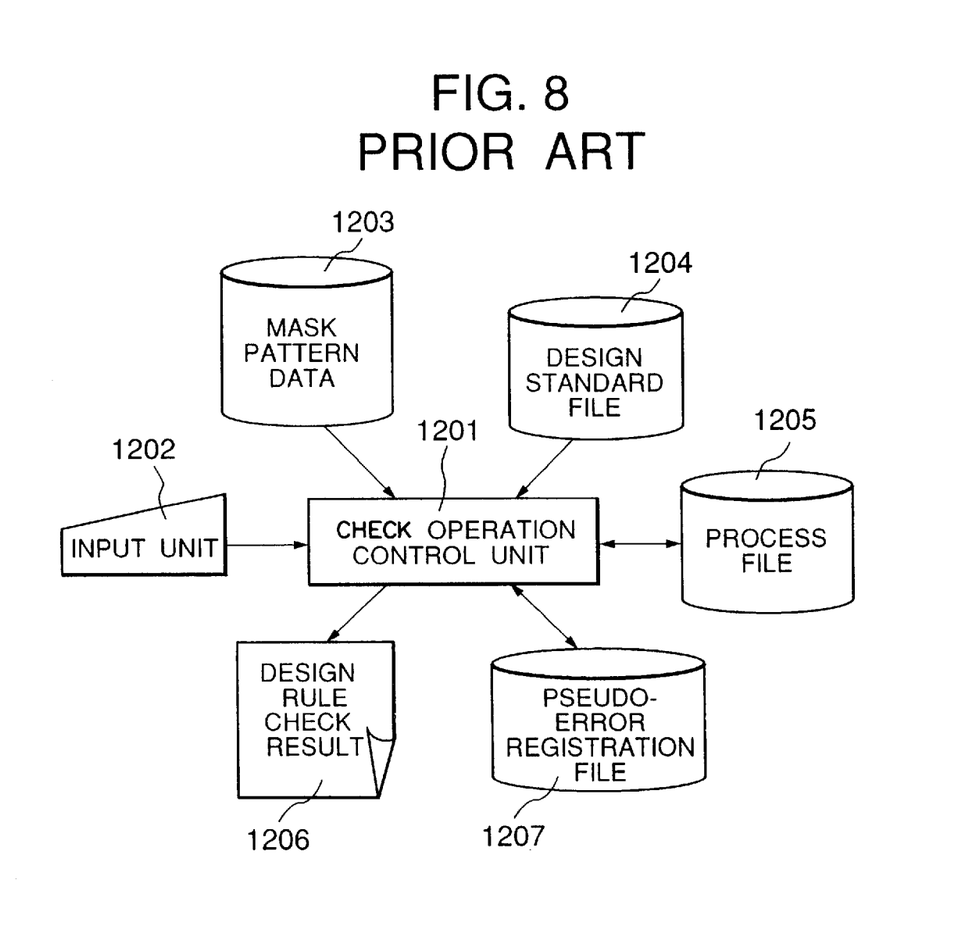
FIG. 8 is a block diagram for explaining the second conventional method.

The second conventional method has a check operation control unit 1201 for receiving data from an input unit 1202, a design standard file 1204, and mask pattern data 1203, for receiving/outputting a process file 1205 and a pseudo-error registration file 1207, and for outputting a design rule check result 1206, as shown in FIG. 8. For a reference, see, e.g., Japanese Unexamined Patent Publication No. 4-36866. The second conventional method will be described under the following assumption, in the same manner as the first conventional method. Namely, assume that the mask pattern data 1203 stores the mask pattern data shown in FIG. 4, and that the design standard file 1204 stores a design rule consisting of a regulation value $R_A$ 203 and regulation value $R_B$ 204 as the regulation values of the spacing between the wiring line 301 of the pad portion and the wiring line 302 outside the pad portion which are described in the design standard example.

In the initial design rule check, a process similar to the design rule check method of the first conventional method is performed by the check operation control unit 1201, and a design rule check error is output to the process file 1205. In this initial design rule check, the pseudo-error registration file 1207 is not specified. Therefore, the content of the process file 1205 is directly output to the design rule check result 1206. Subsequently, whether the design rule check error output to the design rule check result 1206 is a true error or a pseudo-error is manually determined. Regarding a design rule check error which is determined as a pseudo-error (for example, the error B 902 shown in FIGS. 6 and 7B), the content of this pseudo-error is manually written and registered in the pseudo-error registration file 1207 by the input unit 1202. If a design rule error is determined as a true error (for example, the error A 901 shown in FIGS. 6 and 7A), the mask pattern data is corrected manually.

In the second design rule check, the mask pattern data whose true error is corrected in the initial design rule check is stored in the mask pattern data 1203. The pseudo-error registration file 1207 in which registration is performed in the initial design rule check is specified. A process similar to the first conventional design rule check method is performed by the check operation control unit 1201, and a design rule check error is output to the process file 1205. Since the pseudo-error registration file 1207 is specified, the check operation control unit 1201 outputs, to the design rule check result 1206, a design rule check error obtained by removing the content registered in the pseudo-error registration file 1207 from the process file 1205.

Regarding the true error that occurred in the initial design rule check, if the mask pattern data is corrected correctly, the design rule check error output to the process file 1205 in the second design rule check does not include a true error, but includes a pseudo-error identical to the pseudo-error registered in the pseudo-error registration file 1207 in the initial design rule check. Hence, in the second design rule check, a design rule check result 1206 free from a pseudo-error that occurred in the initial design rule check can be obtained.

Figure 9:
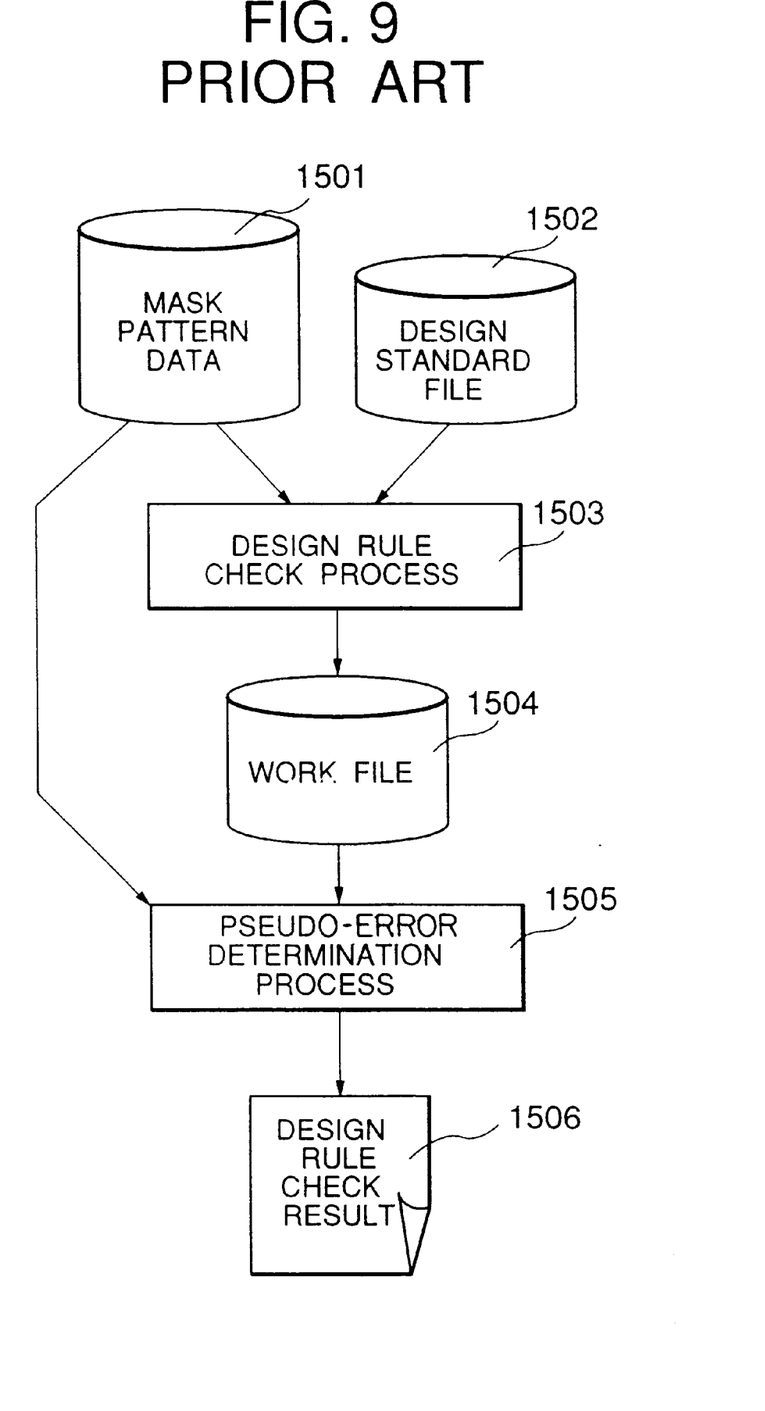
FIG. 9 is a block diagram for explaining the third conventional method.
Figure 10:
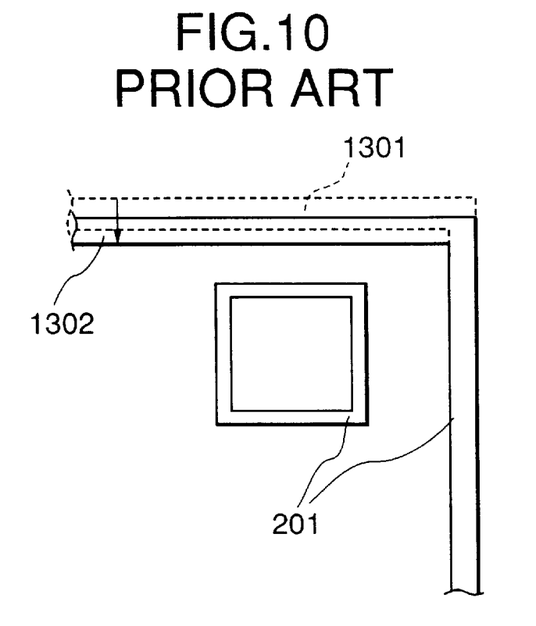
FIG. 10 is a view for explaining master pattern data obtained by correcting the wiring data of the second conventional method shown in FIG. 8.

The third conventional method has a design rule check process 1503 for receiving mask pattern data 1501 and a design standard file 1502 and outputting a design rule check error to a work file 1504, and a pseudo-error determination process 1505 for receiving the mask pattern data 1501 and the work file 1504 and outputting a design rule check error to a design rule check result 1506, as shown in FIG. 9. For a reference, see, e.g., see Japanese Patent Application No. 7-193547. The operation of the third conventional method will be described under the following assumption, in the same manner as in the first conventional method. Namely, assume that the mask pattern data 1501 stores the mask pattern data shown in FIG. 3, and that the design standard file 1502 stores a design rule consisting of a regulation value $R_A$ 203 and regulation value $R_B$ 204 as the regulation values of the spacing between the wiring line 301 of the pad portion and the wiring line 302 outside the pad portion which are described in the design standard example.

The design rule check process 1503 performs a process similar to the design rule check process 507 and design rule check process 509 described in the first conventional method for the wiring line 301 of the pad portion and the wiring line 302 outside the pad portion to obtain a design rule check error (e.g., the error A 901, the error B 902, and the error B 903 shown in FIG. 6), and outputs the obtained design rule check error to the work file 1504. The pseudo-error determination process 1505 reads the design rule check error stored in the work file 1504 as graphic data, and checks whether or not this design rule check error overlaps the mask pattern data stored in the mask pattern data 1501 in accordance with a graphic operation process. A true error and a pseudo-error are determined among the design rule check errors (e.g., the error A 901, the error B 902, and the error B 903 shown in FIG. 6) in accordance with whether or not this overlap is present. Only a true error is output to the design rule check result 1506, so that a design rule check result 1506 free from a pseudo-error can be obtained.

The first to third conventional methods have problems as follows. In the first conventional design rule check method, whether a design rule check error which recurs at one portion is a true error or a kind of pseudo-error is manually determined. The time required for making manual discrimination between a true error and a pseudo-error becomes necessary for the number of design rule check errors that recur, and a determination error can occur due to a human factor.

Figure 11:
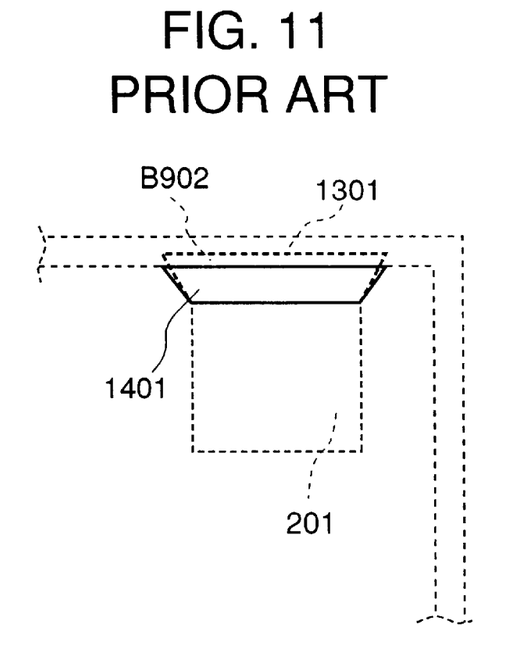
FIG. 11 is a view showing a design rule check error which forms a pseudo-error in the second conventional method shown in FIG. 8.

According to the second conventional design rule check method, a pseudo-error occurring in the initial design rule check is registered and is removed in the second design rule check. Occurrence of a pseudo-error cannot be prevented with one design rule check, and design rule checks are required at least twice. Assume that, in the second design rule check, the wiring data 204 in which a true error has been corrected in the initial design rule check and in which a pseudo-error occurred in the initial design rule check, is corrected (1302) to provide wiring data 1301, and that the resultant mask pattern data is stored in the layout file or mask pattern data 1203 to perform the second design rule check. In this case, the pseudo-error (e.g., the error B 902 shown in FIGS. 6 and 7B) occurring in the initial design rule check and the design rule check error occurring in the second design rule check (e.g., a pseudo-error 1401 shown in FIG. 11) do not coincide. Therefore, the pseudo-error registered in the pseudo-error registration file 1207 is not removed from the design rule check error output to the process file 1205 in the second design rule check, but is output to the design rule check result 1206 as pseudo-error data 1401. Occurrence of pseudo-errors cannot thus be prevented. Whether a design rule check error which recurs at one portion is a true error or a kind of pseudo-error must be manually determined. A time required for making manual determination between a true error and a pseudo-error becomes necessary for the number of design rule check errors that recur, and a determination error can occur due to a human factor, in the same manner as in the first conventional method.

According to the third conventional design rule check method, in the pseudo-error determination process 1505, a pseudo-error is determined by checking whether a design rule check error and the mask pattern data 1501 overlap or not. For example, since the error A 901 and error B 902 shown in FIG. 6 occur at the same portion, they are dealt with equivalently in this determination. In the process which determines the error A 901 as a true error, the error B 902 which should be determined as a pseudo-error is also erroneously determined as a true error and is output to the design rule check result 1506, so that occurrence of pseudo-errors cannot be prevented. Whether a design rule check error which recurs at one portion is a true error or a kind of pseudo-error must be manually determined. The time required for making manual discrimination between a true error and a pseudo-error becomes necessary for the number of design rule check errors that recur, and a determination error can occur due to a human factor, in the same manner as in the conventional methods described above.

SUMMARY OF THE INVENTION

The present invention has been made in view of the above situations of the conventional technique, and has as its object to provide a design rule check method that prevents occurrence of pseudo-errors and does not require manual error determination.

In order to achieve the above object, according to the basic aspect of the present invention, there is provided, in design rule check for inspecting whether or not mask pattern data of a semiconductor integrated circuit is correctly designed in accordance with a design standard, a design rule check method wherein design rule check errors occurring in the design rule check are discriminated between a first error and a second error and are output in accordance with whether or not the design rule check errors overlap.

According to the second aspect of the present invention, there is provided a method according to the basic aspect, having an overlap determination step of checking whether or not input design rule check error A and design rule check error B overlap, determining the design rule check error B not overlapping the design rule check error A as the first error, determining the design rule check error B overlapping the design rule check error A as the second error, and determining the design rule check error A as the first error, wherein the first error is output to a design rule check result.

According to the third aspect of the present invention, there is provided a method according to the basic aspect, having an overlap determination step of checking whether or not input design rule check error A and design rule check error B overlap, determining the design rule check error A not overlapping the design rule check error B as the first error, determining the design rule check error A overlapping the design rule check error B as the second error, and determining the design rule check error B as the first error.

According to the fourth aspect of the present invention, there is provided a method according to either one of the second and third aspect, wherein when neither data on the design rule check error A nor data on the design rule check error B are present, the design rule check error A and the design rule check error B are not output to the design rule check result.

As is apparent from the aspects described above, the characteristic feature of the design rule check method of the present invention resides in that design rule check errors occurring in the design rule check are discriminated between the first error as a signal error and the second error as a pseudo-error in accordance with whether they overlap or not, and the determined errors are output.

As a result, occurrence of pseudo-errors can be prevented by performing a design rule check once. Since occurrence of pseudo-errors is prevented, not only the time required for making manual determination between a true error and a pseudo-error becomes unnecessary, but also a determination error due to a human factor does not occur.

The above and many other objects, features and advantages of the present invention will become manifest to those skilled in the art upon making reference to the following detailed description and accompanying drawings in which preferred embodiments incorporating the principles of the present invention are shown by way of illustrative examples.

DETAILED DESCRIPTION OF PREFERRED EMBODIMENT

A preferred embodiment of the present invention will be described with reference to the accompanying drawings.

Figure 12:
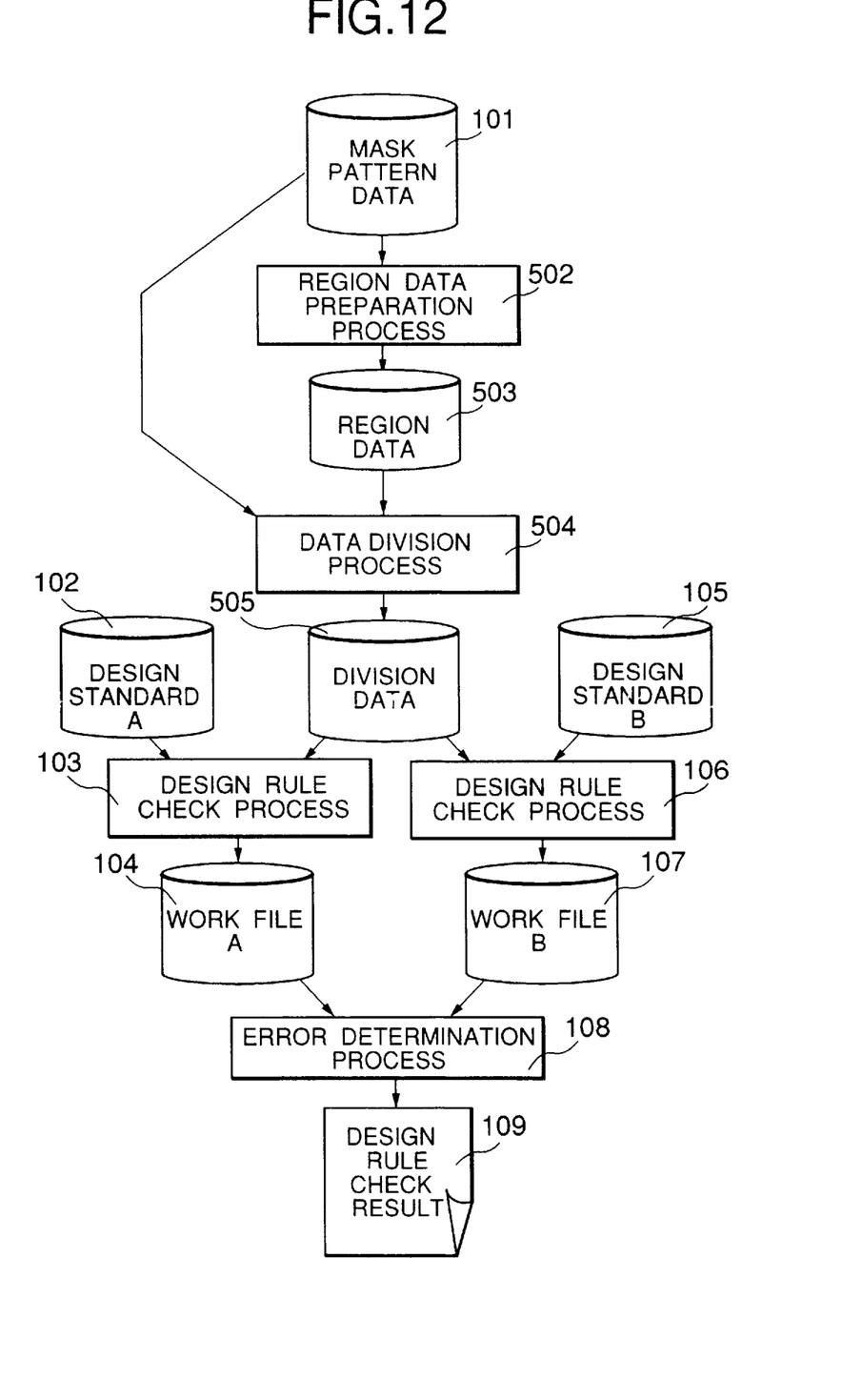
FIG. 12 is a block diagram showing the process of the design rule check method according to an embodiment of the present invention by way of its steps.

FIG. 12 is a block diagram showing the process according to an embodiment of the present invention by means of its steps. In this embodiment, the present invention is applied to a design rule check of mask pattern data that concerns a wiring line of the pad portion and a wiring line outside the pad portion, in the same manner as in the conventional technique described above. More specifically, mask pattern data 101 stores the mask pattern data shown in FIG. 4, in the same manner as in the conventional technique described above. Design standard A 102 stores a design rule consisting of a regulation value $R_A$ 203 as the spacing between the wiring line 301 of the pad portion and the wiring line 302 outside the pad portion which are described in the design standard example. Assume that design standard B 105 stores a design rule consisting of a regulation value $R_B$ 204 as the spacing between the wiring line 301 of the pad portion and the wiring line 302 outside the pad portion which are described in the design standard example, where a design rule check error that can be regarded as a pseudo-error in the prior art occurs.

From a region data preparation process 502 until a design rule check process 103 and a design rule check process 106, processes identical to those of the first conventional method are performed. More specifically, these processes have a region data preparation process 502 for receiving the mask pattern data 101 and outputting region data 503, a data division process 504 for receiving the mask pattern data 101 and region data 503 and outputting division data 505, a design rule check process 103 for receiving the design standard A 102 storing the design rule consisting of the first regulation value $R_A$ 204 and the division data 505, and a design rule check process 106 for receiving the design standard B 105 storing the design rule consisting of the second regulation value $R_A$ 203 and division data 505. Furthermore, a design rule check error defined by the first regulation value $R_A$ 203 output in the design rule check process 103 (e.g., the error A 901 shown in FIGS. 6 and 7A) is output to a work file A 104 as an error A, and a design rule check error defined by the second regulation value $R_B$ 204 output in the design rule check process 106 (e.g., the error B 902 and error B 903 shown in FIGS. 6 and 7B) is output to a work file B 107 as an error B.

Figure 13:
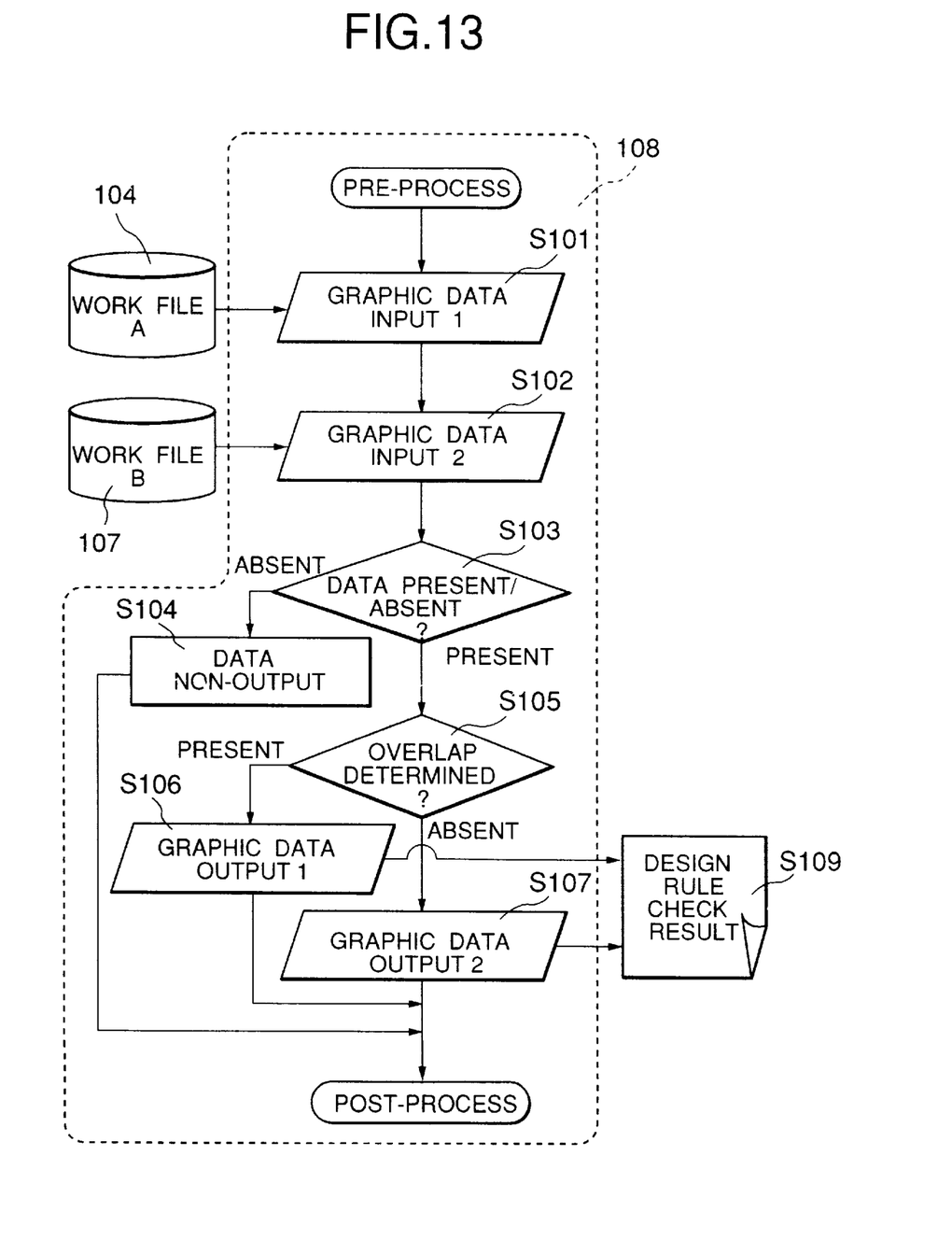
FIG. 13 is a flow chart showing the processing sequence of the error determination process of the embodiment shown in FIG. 12.

The processing sequence of an error determination process 108 will be described. FIG. 13 is a flow chart showing the processing sequence of the error determination process 108. Following the pre-process, in graphic data input 1 step S101, the error A is input from the work file A 104. In graphic data input 2 step S102, the error B is input from the work file B 107. If neither the error A or B exists in data presence/absence step S103, it is determined that data does not exist, and the flow advances to the post-process via data non-output step S104. No design rule check error is output to a design rule check result 109.

If data exists in data presence/absence step S103, whether or not the errors A and B overlap is determined in overlap determination step S105. If the errors A and B overlap, the error A, e.g., the error A 901 shown in FIGS. 6 and 7A, is regarded as a first error (true error), and is output to the design rule check result 109 in graphic data output 1 step S106. The error B, e.g., the error B 902 shown in FIGS. 6 and 7A, is regarded as a second error (pseudo-error), and is not output to the design rule check result 109. If the errors A and B do not overlap, the error B, e.g., the error B 903 shown in FIGS. 6 and 7A, is regarded as a first error, and is output to the design rule check result 109 in graphic data output 2 step S107. If the errors A and B do not overlap, regulation value $R_A$ 203<regulation value $R_B$ 204 holds, as described in the design standard example, and the error A does not exist at this portion.

Tables 1 and 2 show examples of the structure of a graphic data storage memory used in steps S101 to S103, and steps S105 to S107 of the error determination process 108. The graphic data storage memory has a column structure consisting of a data presence/absence flag, coordinate data, and a first error flag, and each column consists of rows of a count equal to the count of graphic data plus one row, thus constituting a row structure.

TABLE 1 a. Memory A

| | 1<br>Data<br>Presence/<br>Absence<br>Flag | 2<br>Coordinate Data | 3<br>First<br>Error<br>Flag |
|---|---|---|---|
| 1 | 1 | (Xa11, Ya11:Xa12, Ya12:<br>Xa13, Ya13:Xa14, Ya14) | 1 |
| 2 | 0 | — | — |

TABLE 2 b. Memory B

| | 1<br>Data<br>Presence/<br>Absence<br>Flag | 2<br>Coordinate Data | 3<br>First<br>Error<br>Flag |
|---|---|---|---|
| 1 | 1 | (Xb11, Yb11:Xb12, Yb12:<br>Xb13, Yb13:Xb14, Yb14) | 1 |
| 2 | 1 | (Xb21, Yb21:Xb22, Yb22:<br>Xb23, Yb23:Xb24, Yb24) | 1 |
| 3 | 0 | — | — |

The graphic data storage memory (a. memory A and b. memory B) shown in Tables 1 and 2 has a column structure as follows. A "1" data presence/absence flag indicates a case wherein graphic data is present and a "0" data presence/ absence flag a case wherein the graphic data storage memory is ended or no data is present. Regarding the coordinate data, the coordinate values of all the vertices of the graphic data are shown inside the parentheses ( ) with separation ":" in accordance with the order with which the sides of the graphic data are connected, while the X and Y coordinates of the coordinate values of the vertices are separated with ",". A "1" first error flag indicates a case wherein the graphic data is the first error and a "0" first error flag a case wherein the graphic data is not the first error.

The a. memory A shows a state wherein the error A stored in the work file A 104 is input in graphic data input 1 step S101 and arranged on the graphic data storage memory (e.g., the error A 901 shown in FIGS. 6 and 7A is on the first row), and the b. memory B shows a state wherein the error B stored in the work file B 107 is input in graphic data input 2 step S102 and arranged on the graphic data storage memory (e.g., the error B 902 and error B 903 shown in FIGS. 6 and 7B are respectively on the first and second rows). In both the a. memory A and b. memory B, immediately after the input, the first error flag is set to "1", and in the final row, the data presence/absence flag is set to "0" in order to indicate the end of the graphic data storage memory.

In data presence/absence step S103, absence of data is determined in accordance with whether or not the data presence/absence flag of the first row is "0" in each of the a. memory A and b. memory B. In overlap determination step S105, a set of coordinate data (e.g., the coordinate data of the first row of the a. memory A and the coordinate data of the first row of the b. memory B) are read from the a. memory A and b. memory B. If the coordinate values of all the vertices of the coordinate data of the a. memory A are located within a region indicated by the coordinate values of the respective vertices of the coordinate data of the b. memory B, it is determined that an overlap exists, and the first error flag of a row corresponding to the coordinate data of the b. memory B is changed to "0", thus realizing an overlap determination process. This process is performed for all the combinations of the coordinate data of the a. memory A and b. memory B that do not have an overlap, so that an overlap determination process is performed for all the graphic data on the graphic data storage memory.

In graphic data output 1 step S106 and graphic data output 2 step S107, coordinate data corresponding to a row where the first error flag and the data presence/absence flag of the graphic data storage memory are respectively "1" and "1" is output to the design rule check result 109 as graphic data.

In this explanation, an overlap is determined when the coordinate values of all the vertices in the coordinate data of the a. memory A are located within the region indicated by the coordinate values of the respective vertices of the coordinate data of the b. memory B. However, depending on the design standard employed, even if the region indicated by the coordinate values of the respective vertices of the coordinate data of the a. memory A partly overlaps the region indicated by the coordinate values of the respective vertices of the coordinate data of the b. memory B, an overlap may be determined. In this case, an overlap is determined when at least one coordinate value of a vertex of the coordinate data of the a. memory A is located within the region indicated by the coordinate values of the respective vertices of the coordinate data of the b. memory B. Then, the same effect as that described above can be obtained.

The present invention is not limited to the embodiment described above, but can be constituted as follows. Firstly, the error determination process 108 has data presence/absence step S103. However, when no data to be output is present in graphic data output steps 1 S106 and 2 S107 and a process for not outputting data to the design rule check result is possible, even if data presence/absence step S103 and data non-output step S104 are omitted, the same effect as that described above can be obtained.

Secondly, in the above embodiment, pad opening data is used in order to obtain the wiring data of the pad portion. If the wiring data of the pad portion can be obtained by using another mask pattern data, the same process as that of the present invention may be performed by using another mask pattern to obtain the same effect as described above.

Thirdly, in the above embodiment, a design rule check on the spacing of the wiring data is described in detail. However, the present invention is not limited to a design rule check on the width of the wiring data or on wiring data of the bonding pad portion. Even in a design rule check of another mask pattern data, if a plurality of design standards exist at one portion on the mask pattern, the same process as that described above may be performed to obtain the same effect.

Fourthly, in the above embodiment, in the explanation of overlap determination step S105, when an overlap exists, the error A is regarded as a first error. However, depending on the design standard employed, if the error B is regarded as a true error, graphic data output 1 step S106 may be altered such that the error B is regarded as a first error and that the error A is regarded as a second error, thus obtaining the same effect.

Fifthly, in the above embodiment, after the mask pattern data is divided by using a data division process, a design rule check process is performed. Depending on the arrangement of the mask pattern data and the design standard employed, if a data division process is not required (e.g., if the wiring line of the pad portion and the wiring line outside the pad portion are constituted as different data on the mask pattern data), the region data preparation process 502 and data division process 504 may be omitted and the same process may be performed by using the mask pattern data 101 as inputs to the design rule check processes 103 and 106, thus obtaining the same effect as described above.

What we claim is:

1. A design rule check method in a design rule check for inspecting whether mask pattern data of a semiconductor integrated circuit is correctly designed in accordance with design standards, the design rule check method comprising the steps of:

determining and outputting a first input design rule check error A and a second input design rule check error B from a first design rule check process and a second design rule check process, respectively;

determining a design rule check result based on the first input design rule check error A and the second input design rule check error B in accordance with whether the first input design rule error A overlaps the second input design rule error B overlaps; and outputting said design rule check result.

2. The method according to claim 1, wherein the step of determining a design rule check result includes the steps of an overlap determining step that checks whether the first input design rule check error A and the second input design rule check error B overlap, determining the second input design rule check error B not overlapping the first input design rule check error A as a first error, determining the second input design rule check error B overlapping the first input design rule check error A as a second error, and outputting the first error as the design rule check result.

3. The method according to claim 1, wherein the step of determining a design rule check result includes the steps of an overlap determining step that checks whether the first input design rule check error A and the second input design rule check error B overlap, determining the first input design rule check error A not overlapping the second input design rule check error B as the first error, determining the first input design rule check error A overlapping the second input design rule check error B as the second error, and outputting the first error as the design rule check result.

4. A method according to claim 2, wherein when neither data on the first input design rule check error A nor data on the second input design rule check error B are present, neither the first input design rule check error A nor the second input design rule check error B are output as the design rule check result.

5. A method according to claim 3, wherein when neither data on the first input design rule check error A nor data on the second input design rule check error B are present, neither the first input design rule check error A nor the second input design rule check error B are output as the design rule check result.

* * * * *